(12) United States Patent
Park et al.

(10) Patent No.: US 10,937,848 B2
(45) Date of Patent: Mar. 2, 2021

(54) ORGANIC LIGHT-EMITTING DIODE DISPLAY

(71) Applicant: SAMSUNG DISPLAY CO., LTD., Yongin-si (KR)

(72) Inventors: Ok-Kyung Park, Hwaseong-si (KR); Su Yeon Yun, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/261,437

(22) Filed: Jan. 29, 2019

(65) Prior Publication Data

US 2019/0157368 A1    May 23, 2019

Related U.S. Application Data

(63) Continuation of application No. 15/688,760, filed on Aug. 28, 2017, now Pat. No. 10,347,703, which is a (Continued)

(30) Foreign Application Priority Data

Apr. 26, 2013    (KR) .................. 10-2013-0046996

(51) Int. Cl.
*H01L 27/32*    (2006.01)
*H01L 51/52*    (2006.01)
*G02F 1/1362*    (2006.01)

(52) U.S. Cl.
CPC ...... *H01L 27/3262* (2013.01); *H01L 27/3216* (2013.01); *H01L 27/3218* (2013.01); (Continued)

(58) Field of Classification Search
CPC ............. H01L 27/3262; H01L 27/3276; H01L 27/3218; H01L 27/3246; H01L 27/3216; H01L 51/525
See application file for complete search history.

(56) References Cited

U.S. PATENT DOCUMENTS

| 4,642,619 A | 2/1987 | Togashi |
|---|---|---|
| 6,366,025 B1 | 4/2002 | Yamada |

(Continued)

FOREIGN PATENT DOCUMENTS

| CN | 101009304 A | 8/2007 |
|---|---|---|
| CN | 101449382 A | 6/2009 |

(Continued)

OTHER PUBLICATIONS

EPO Communication Pursuant to Article 94(3) EPC, for Patent Application No. 13 178 648.5, dated Jan. 31, 2019, 8 pages.

(Continued)

*Primary Examiner* — Dung A. Le
(74) *Attorney, Agent, or Firm* — Lewis Roca Rothgerber Christie LLP

(57) ABSTRACT

An organic light emitting diode (OLED) display includes: a first electrode around a center point of a virtual tetragon, e.g., a virtual square; second electrodes around a first vertex and a second vertex diagonal to the first vertex of the virtual square, the second electrodes being separated from each other and with the center point of the virtual square interposed therebetween; third electrodes around a third vertex and a fourth vertex of the virtual square, the third electrodes being separated from each other and with the center point of the virtual square interposed therebetween; a pixel defining layer partially on the first electrode, the second electrodes, and the third electrodes, and partially exposing the first electrode, the second electrodes, and the third electrodes; and four spacers disposed as islands on the pixel defining layer and corresponding to four sides of the virtual square.

20 Claims, 3 Drawing Sheets

Related U.S. Application Data continuation of application No. 15/090,591, filed on Apr. 4, 2016, now Pat. No. 9,837,476, which is a continuation of application No. 14/059,356, filed on Oct. 21, 2013, now Pat. No. 9,431,469.

(52) U.S. Cl.
CPC ...... *H01L 27/3246* (2013.01); *H01L 27/3276* (2013.01); *H01L 51/525* (2013.01); *G02F 1/1362* (2013.01)

(56) References Cited

U.S. PATENT DOCUMENTS

| | | |
|---|---|---|
| 6,867,549 B2 | 3/2005 | Cok et al. |
| 6,882,364 B1 | 4/2005 | Inuiya et al. |
| 7,110,031 B2 | 9/2006 | Kondo et al. |
| 7,274,383 B1 | 9/2007 | Brown Elliot |
| 7,710,484 B2 | 5/2010 | Oda |
| 7,982,786 B2 | 7/2011 | Nishida et al. |
| 8,026,669 B2 | 9/2011 | Kawasaki et al. |
| 8,330,352 B2 | 12/2012 | Sung et al. |
| 8,350,468 B2 | 1/2013 | Ko et al. |
| 8,354,789 B2 | 1/2013 | Kim et al. |
| 9,431,469 B2 * | 8/2016 | Park ................... H01L 51/525 |
| 9,837,476 B2 | 12/2017 | Park et al. |
| 2002/0015110 A1 | 2/2002 | Brown Elliott |
| 2002/0070909 A1 | 6/2002 | Asano et al. |
| 2002/0113195 A1 | 8/2002 | Osada |
| 2002/0140833 A1 | 10/2002 | Hirai |
| 2003/0128179 A1 | 7/2003 | Credelle |
| 2003/0128225 A1 | 7/2003 | Credelle et al. |
| 2004/0108818 A1 | 6/2004 | Cok et al. |
| 2004/0183764 A1 | 9/2004 | Kim et al. |
| 2004/0246426 A1 | 12/2004 | Wang et al. |
| 2005/0001542 A1 | 1/2005 | Kiguchi |
| 2005/0162079 A1 | 7/2005 | Sakamoto |
| 2006/0152531 A1 | 7/2006 | Lin et al. |
| 2006/0274090 A1 | 12/2006 | Koyama et al. |
| 2008/0001525 A1 | 1/2008 | Chao et al. |
| 2008/0001527 A1 | 1/2008 | Koo et al. |
| 2008/0273793 A1 | 11/2008 | Oishi |
| 2008/0308819 A1 | 12/2008 | Louwsma et al. |
| 2009/0302331 A1 | 12/2009 | Smith et al. |
| 2010/0033084 A1 | 2/2010 | Ko et al. |
| 2010/0117528 A1 | 5/2010 | Fukuda |
| 2010/0133994 A1 | 6/2010 | Song et al. |
| 2010/0171440 A1 | 7/2010 | Satou et al. |
| 2011/0012820 A1 | 1/2011 | Kim et al. |
| 2011/0291549 A1 | 12/2011 | Kim et al. |
| 2011/0291550 A1 | 12/2011 | Kim et al. |
| 2012/0049726 A1 | 3/2012 | Yoo et al. |
| 2012/0056531 A1 | 3/2012 | Park et al. |
| 2012/0086330 A1 | 4/2012 | Umeda et al. |
| 2012/0287605 A1 | 11/2012 | Chen et al. |
| 2012/0313844 A1 | 12/2012 | Im et al. |
| 2012/0319564 A1 | 12/2012 | Ghosh et al. |
| 2013/0002911 A1 | 1/2013 | Miyashita et al. |
| 2013/0037827 A1 | 2/2013 | Levermore et al. |
| 2013/0057521 A1 | 3/2013 | Kim |
| 2013/0106891 A1 | 5/2013 | Matsueda et al. |
| 2013/0127689 A1 | 5/2013 | Gollier |
| 2015/0192834 A1 | 7/2015 | Morinaga et al. |

FOREIGN PATENT DOCUMENTS

| | | |
|---|---|---|
| CN | 103311266 A | 9/2013 |
| CN | 203260586 U | 10/2013 |
| CN | 105206647 A | 12/2015 |
| EP | 2 637 209 A1 | 9/2013 |
| GB | 2 437 110 A | 10/2007 |
| JP | 3-36239 | 5/1991 |
| JP | 10-39791 | 2/1998 |
| JP | 2000-235891 A | 8/2000 |
| JP | 2003-203770 A | 7/2003 |
| JP | 2004-507773 | 3/2004 |
| JP | 2004-179028 A | 6/2004 |
| JP | 2004-192813 | 7/2004 |
| JP | 2005-5227 A | 1/2005 |
| JP | 2006-18195 A | 1/2006 |
| JP | 2006-309182 A | 11/2006 |
| JP | 2007-156126 A | 6/2007 |
| JP | 2008-015521 A | 1/2008 |
| JP | 2008-300367 | 12/2008 |
| JP | 2009-230096 A | 10/2009 |
| JP | 2010-3880 A | 1/2010 |
| JP | 2010-153173 A | 7/2010 |
| JP | 2011-076760 | 4/2011 |
| JP | 2011-198761 A | 10/2011 |
| KR | 10-2004-0096706 A | 11/2004 |
| KR | 10-0742370 B1 | 7/2007 |
| KR | 10-0807524 B1 | 2/2008 |
| KR | 10-2008-0111130 | 12/2008 |
| KR | 10-2009-0017910 A | 2/2009 |
| KR | 10-2009-0049515 A | 5/2009 |
| KR | 10-2011-0023996 A | 3/2011 |
| KR | 10-2011-0106565 A | 9/2011 |
| KR | 10-2011-0129531 | 12/2011 |
| KR | 10-2012-0022967 | 3/2012 |
| TW | I328207 B | 8/2010 |
| WO | WO 03/053068 A2 | 6/2003 |
| WO | WO 2004/073356 A1 | 8/2004 |
| WO | WO 2005/067352 A1 | 7/2005 |

OTHER PUBLICATIONS

EPO Search Report dated Jul. 8, 2013, for corresponding European Patent application 13157562.3, (6 pages).
EPO Search Report dated Dec. 20, 2013, for European Patent application 13178648.5, (9 pages).
EPO Search Report dated Jul. 9, 2014, for corresponding European Patent application 14155124.2, (8 pages).
JPO Office action dated Feb. 16, 2016, for corresponding Japanese Patent application 2012-108855, (5 pages).
Korean Patent Abstracts for Korean Publication 1020070055908 dated May 31, 2007, corresponding to Korean Patent 10-0742370 dated Jul. 24, 2007.
KIPO Office action dated Jul. 11, 2016, with English translation, for Korean Patent application 10-2016-0047800, (11 pages).
SIPO Office action dated Mar. 11, 2015, corresponding to Chinese Patent application 201310035429.X, (7 pages).
Taiwan Office action dated Mar. 30, 2015, corresponding to Taiwanese Patent application 102101000, (7 pages).
TIPO Office Action dated Oct. 11, 2016, corresponding to Taiwanese Patent Application No. 102124953 (6 pages).
U.S. Office action dated Nov. 7, 2014, for cross reference U.S. Appl. No. 13/614,197, (16 pages).
U.S. Office action dated Mar. 12, 2015, for cross reference U.S. Appl. No. 13/614,197, (13 pages).
U.S. Office action dated Jun. 30, 2015 issued in U.S. Appl. No. 13/872,018, (22 pages).
U.S. Office action dated Jul. 15, 2015 issued in U.S. Appl. No. 13/614,197, (12 pages).
U.S. Office action dated Oct. 16, 2015 issued in U.S. Appl. No. 13/872,018, (16 pages).
U.S. Office action dated Dec. 2, 2015, for cross reference U.S. Appl. No. 13/614,197, (12 pages).
U.S. Office Action dated Aug. 29, 2014, issued in cross-reference U.S. Appl. No. 14/059,356 (14 pages).
U.S. Office action dated Feb. 29, 2016, for cross reference U.S. Appl. No. 13/872,018, (15 pages).
U.S. Office action dated Apr. 7, 2016, for cross reference U.S. Appl. No. 13/614,197, (13 pages).
U.S. Office Action dated Sep. 2, 2016, issued in cross-reference U.S. Appl. No. 13/872,018 (15 pages).
U.S. Office Action dated Oct. 14, 2016, issued in cross-reference U.S. Appl. No. 13/614,197 (12 pages).
U.S. Office Action dated Dec. 30, 2016, for U.S. Appl. No. 13/872,018 (14 pages).

(56) References Cited

OTHER PUBLICATIONS

U.S. Office Action dated May 11, 2017, issued in cross-reference U.S. Appl. No. 13/872,018 (16 pages).
U.S. Office Action dated Jul. 11, 2018, issued in U.S. Appl. No. 15/811,599 19 (pages).
Office action issued in U.S. Appl. No. 15/811,599 by the USPTO, dated Jul. 19, 2019, 19 pages.
U.S. Office Action dated Oct. 25, 2019, issued in U.S. Appl. No. 16/505,536 (14 pages).
U.S. Office Action dated Apr. 30, 2020, issued in U.S. Appl. No. 16/505,536 (14 pages).

* cited by examiner

ORGANIC LIGHT-EMITTING DIODE DISPLAY

CROSS-REFERENCE TO RELATED APPLICATION

This application is a continuation of U.S. patent application Ser. No. 15/688,760, filed Aug. 28, 2017, which is a continuation of U.S. patent application Ser. No. 15/090,591, filed Apr. 4, 2016, now U.S. Pat. No. 9,837,476, which is a continuation of U.S. patent application Ser. No. 14/059,356, filed Oct. 21, 2013, now U.S. Pat. No. 9,431,469, which claims priority to and the benefit of Korean Patent Application No. 10-2013-0046996, filed Apr. 26, 2013, the entire contents of all of which are incorporated herein by reference.

BACKGROUND

(a) Field

Aspects of embodiments of the present invention relate to an organic light emitting diode (OLED) display.

(b) Description of the Related Art

A display device is a device for displaying an image. Recently, OLED displays have received attention. Since OLED displays have self-emission characteristics and do not require separate light sources, which is unlike liquid crystal display devices, it is possible to reduce their thickness and weight when compared to those of older technologies. Further, OLED displays have high-quality characteristics such as low power consumption, high luminance, and high response speed.

In general, an OLED display includes a first substrate, a first electrode disposed on the first substrate, a pixel defining layer including an opening that exposes the first electrode, an organic emission layer disposed on the first electrode corresponding to the opening, a second electrode disposed on the organic emission layer, and a second substrate disposed on the first electrode.

A more recent OLED display may further include a spacer disposed on a pixel defining layer to reduce or minimize interference due to the second substrate by increasing a gap between an organic emission layer and the second substrate. However, in a conventional OLED display including a spacer, the spacer is simply disposed on an unopened portion of the pixel defining layer without regard to the shape of the opening included in the pixel defining layer.

The above information disclosed in this Background section is only for enhancement of understanding of the background of the present invention and therefore it may contain information that does not form the prior art that is already known in this country to a person of ordinary skill in the art.

SUMMARY

Embodiments of the present invention relate to a pixel alignment structure of an organic light emitting device. More particularly, embodiments of the present invention relate to a pixel structure including an OLED and spacers disposed on a pixel defining layer that exposes a first electrode of the OLED.

Embodiments of the present invention provide for an OLED display including spacers disposed on a pixel defining layer and considering the shape of openings included in the pixel defining layer to reduce or minimize interference of a substrate with respect to an organic emission layer by increasing an area ratio of the spacers in the entire area of the OLED display.

In an embodiment of the present invention, an organic light emitting diode (OLED) display is provided. The OLED display includes: a first electrode around a center point of a virtual tetragon, e.g., a virtual square; second electrodes around a first vertex and a second vertex diagonal to the first vertex of the virtual square, the second electrodes being separated from each other and with the center point of the virtual square interposed therebetween; third electrodes around a third vertex and a fourth vertex of the virtual square, the third electrodes being separated from each other and with the center point of the virtual square interposed therebetween; a pixel defining layer partially on the first electrode, the second electrodes, and the third electrodes, and partially exposing the first electrode, the second electrodes, and the third electrodes; and four spacers disposed as islands on the pixel defining layer and corresponding to four sides of the virtual square.

The pixel defining layer may have a first opening that exposes the first electrode and has a first polygon shape whose center coincides with the center point of the virtual square, second openings that expose the second electrodes and have second polygonal shapes whose centers coincide with the first vertex and the second vertex, and third openings that expose the third electrodes and have third polygonal shapes whose centers coincide with the third vertex and the fourth vertex.

Distances between the center point of the virtual square and centers of the four spacers may be the same.

Each of the four spacers may have a square shape.

Each of the spacers may have a rectangle shape having long sides that are bisected by a respective one of the four sides of the virtual square.

Each of the second openings and the third openings may have a larger area compared to that of the first opening.

Each of the second openings may have a larger area than that of each of the third openings.

At least one of the first polygonal shape, the second polygonal shapes, or the third polygonal shapes may be an octagon.

The first polygonal shape may be an octagon, and one of the second polygonal shapes and one of the third polygonal shapes may be a hexagon and a quadrilateral.

The first opening may include a plurality of first openings, and neighboring ones of the plurality of first openings may have symmetrical octagonal shapes.

Distances between the first opening and each of the second openings, and distances between the first opening and each of the third openings may be a same first length.

Distances between each of the second openings and each of the third openings may be a same second length, and distances between the neighboring ones of the plurality of first openings may be a same third length that is longer than each of the first length and the second length.

The OLED display may further include a first organic emission layer on the first electrode corresponding to the first opening, second organic emission layers on the second electrodes and corresponding to the second openings, and third organic emission layers on the third electrodes and corresponding to the third openings.

The first organic emission layer may be configured to emit a first color light, the second organic emission layers may be configured to emit a second color light different from the first color light, and the third organic emission layers may be configured to emit a third color light different from the first color light and the second color light.

The first color light may be green, and the second color light and the third color light may be blue and red.

According to one embodiment of the present invention, spacers are provided on a pixel defining layer of the OLED display in consideration of the shape of openings included in the pixel defining layer to reduce or minimize interference of a substrate with respect to an organic emission layer by increasing an area ratio of the spacers to the entire area.

DETAILED DESCRIPTION

Figure 1:
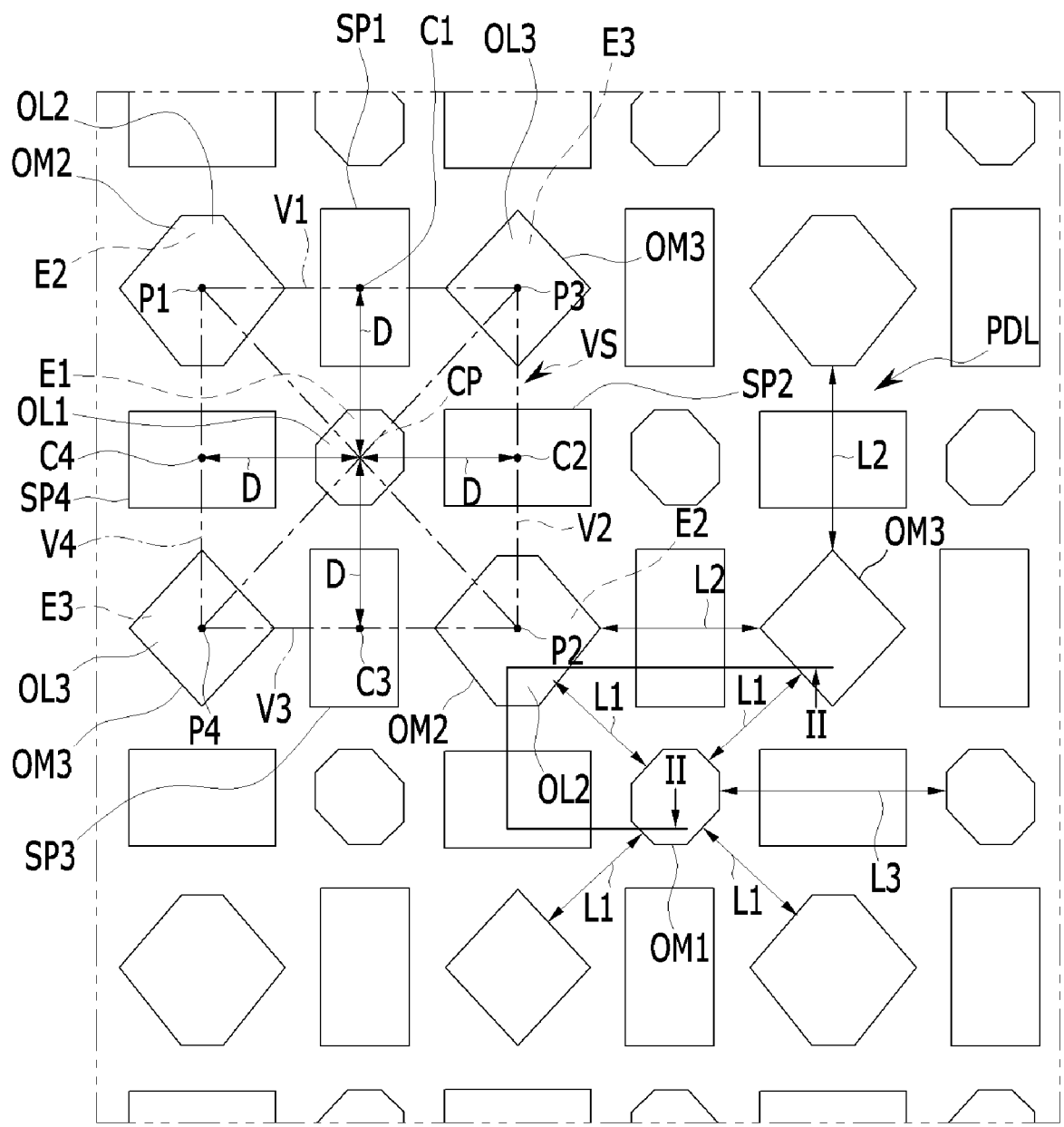
FIG. 1 partially shows a plane surface of an OLED display according to a first embodiment of the present invention.

In the following detailed description, only certain embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification. In addition, the size and thickness of each configuration shown in the drawings may be arbitrarily shown for better understanding and ease of description, but the present invention is not limited thereto.

In addition, unless explicitly described to the contrary, the word "comprise" and variations such as "comprises" or "comprising" will be understood to imply the inclusion of stated elements but not the exclusion of any other elements. Throughout, when a first element is described as being "coupled" to a second element, it may be directly coupled (e.g., connected) to the second element or indirectly coupled (e.g., electrically connected) to the second element via one or more third elements. Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

Figure 2:
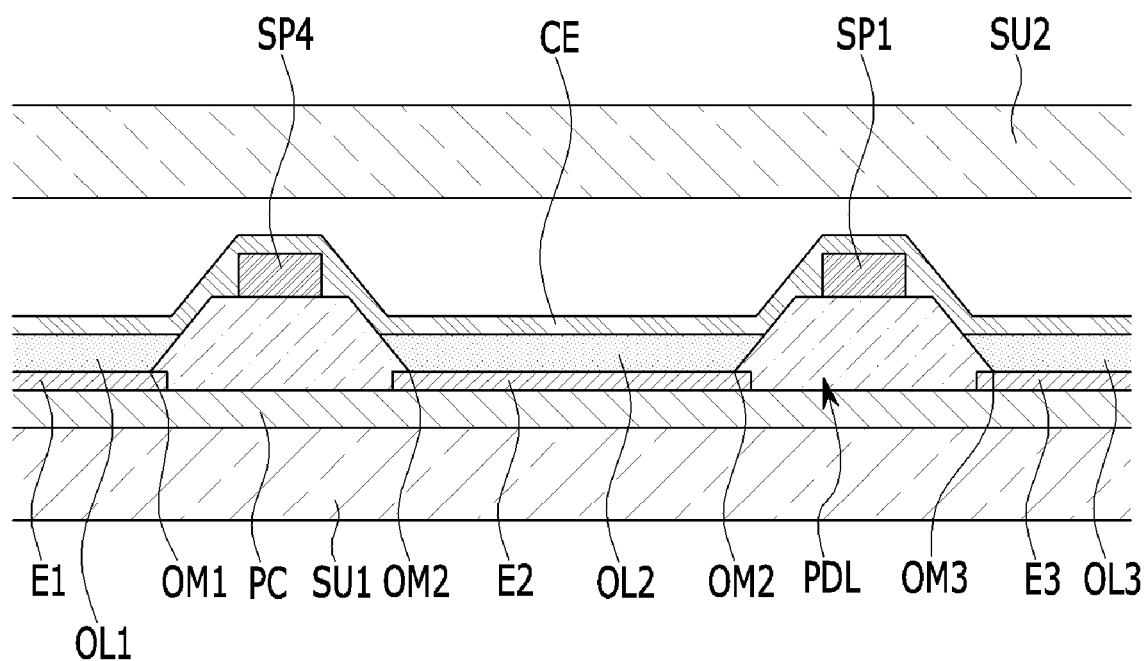
FIG. 2 is a cross-sectional view of FIG. 1 taken along the line II-II.

Hereinafter, an OLED display 1000 according to a first embodiment of the present invention will described with reference to FIG. 1 and FIG. 2. FIG. 1 partially shows a plane surface of the OLED display 1000. For convenience, a first electrode, a pixel defining layer, an organic emission layer, and a spacer are mainly illustrated in FIG. 1. FIG. 2 is a cross-sectional view of FIG. 1 taken along the line II-II.

As shown in FIG. 1 and FIG. 2, the OLED display 1000 includes a first substrate SU1, a circuit portion PC, a first electrode E1, a second electrode E2, a third electrode E3, a pixel defining layer PDL, a first organic emission layer OL1, a second organic emission layer OL2, a third organic emission layer OL3, a first spacer SP1, a second spacer SP2, a third spacer SP3, a fourth spacer SP4, a common electrode CE, and a second substrate SU2.

The first substrate SU1 is formed of an insulating substrate made of glass, quartz, ceramic, metal, plastic, or the like. In addition, when the first substrate SU1 is made of plastic, the OLED display 1000 may have a flexible, stretchable, or rollable characteristic.

The circuit portion PC is disposed on the first substrate SU1, and may include wires including one or more scan lines, data lines, driving power lines, common power lines, pixel circuits, and the like. Each pixel circuit may correspond to one pixel and may include two or more thin film transistors (TFTs) coupled to the wires, one or more capacitors, and the like. The circuit portion PC may be formed to have various structures known to one of ordinary skill in the art.

The first electrode E1 is positioned on the circuit part PC, and is coupled to one of the TFTs of the circuit part PC. A central area of the first electrode E1 is positioned at a center point CP of a virtual tetragon, e.g., a virtual square VS.

Here, the virtual square VS includes the center point CP, a first vertex P1, a second vertex P2, a third vertex P3, a fourth vertex P4, a first side V1, a second side V2, a third side V3, and a fourth side V4. In further detail, the first side V1 of the virtual square VS connects between the first vertex P1 and the third vertex P3, the second side V2 connects between the third vertex P3 and the second vertex P2, the third side V3 connects between the second vertex P2 and the fourth vertex P4, and the fourth side V4 connects between the fourth vertex P4 and the first vertex P1. In addition, the first vertex P1 and the second vertex P2 of the virtual square VS are diagonal to each other (with the center point CP interposed therebetween), the third vertex P3 and the fourth vertex P4 are diagonal to each other (with the center point CP interposed therebetween), and both the third vertex P3 and the fourth vertex P4 neighbor both the first vertex P1 and the second vertex P2.

The first side V1, the second side V2, the third side V3, and the fourth side V4 have the same length such that the virtual square VS is formed. The first electrode E1 may have various polygonal shapes, and a center area of the first electrode E1 is exposed by a first opening portion (or first opening) OM1 of the pixel defining layer PDL.

The second electrode E2 is disposed on the circuit portion PC and is separated from the first electrode E1. The second electrode E2 is coupled to a TFT of the circuit portion PC. Within and around the virtual square VS, the second electrode E2 is provided as a pair of second electrodes E2, and the second electrodes E2 are separated from each other, with the first electrode E1 interposed therebetween. Respective center areas of the second electrodes E2 are disposed around the first vertex P1 and the second vertex P2 of the virtual square VS. The second electrode E2 may have various polygonal shapes, and the center area of the second electrode E2 may be exposed by a second opening portion (or second opening) OM2 of the pixel defining layer PDL.

The third electrode E3 is separated from the first electrode E1 and the second electrode E2, and is disposed on the circuit portion PC. The third electrode E3 is coupled to one of the TFTs of the circuit portion PC. Within and around the virtual square VS, the third electrode E3 is provided as a pair of third electrodes E3, and the third electrodes E3 are separated from each other, with the first electrode E1 interposed therebetween. Center regions of the respective third electrodes E3 are disposed on the third vertex P3 and the fourth vertex P4 of the virtual square VS. The third electrode E3 may have various polygonal shapes, and the center area of the third electrode E3 is exposed by a third opening portion (or third opening) OM3 of the pixel defining layer PDL.

The second electrodes E2 and the third electrodes E3 are disposed on and around the virtual square VS, with the first electrode E1 interposed therebetween. That is, the second electrodes E2 and the third electrodes E3 surround the first electrode E1, centering the first electrode E1. The first electrode E1, the second electrodes E2, and the third electrodes E3 may be anodes or cathodes functioning as hole injection electrodes. The first electrode E1, the second electrodes E2, and the third electrodes E3 may be formed as light transmissive electrodes or light reflective electrodes.

The pixel defining layer PDL is disposed on the first electrode E1, the second electrode E2, and the third electrode E3, and covers the edge of each of the first electrode E1, the second electrode E2, and the third electrode E3. The pixel defining layer PDL includes the first opening portion OM1, the second opening portion OM2, and the third opening portion OM3, respectively exposing the first electrode E1, the second electrode E2, and the third electrode E3.

The first opening OM1 exposes the first electrode E1, and has a first polygonal shape, for example, an octagon. The first opening OM1 is separated from the third opening OM3 and the second opening OM2, and the center of the first opening OM1 coincides with the center point CP of the virtual square VS. The first opening OM1 has a smaller area compared to the second opening OM2 and the third opening OM3 that neighbor the first opening OM1. While the first opening OM1 in FIG. 1 is formed in the shape of an octagon, the shape of the first opening OM1 is not limited thereto. In other embodiments, the first opening OM1 may have various polygonal shapes such as a triangle, a quadrilateral, a pentagon, a hexagon, a heptagon, or the like.

While the above description focused on a single virtual square VS having a single first electrode E1, the OLED display 1000 has a plurality of virtual squares VS, each centered with a different one of a corresponding plurality of first electrodes E1 and first openings OM1. In the OLED display 1000 of FIG. 1, all neighboring (e.g., sharing a same row or column) first openings OM1 among the plurality of first openings OM1 have symmetric octagonal shapes (that are mirror images of each other), while all diagonal first openings OM1 have the same octagonal shape. In other embodiments, each of the plurality of first openings OM1 may have the same octagonal shape.

In the OLED display 1000 of FIG. 1, a first organic emission layer OL1 for emitting green light is disposed on each first electrode E1 that is exposed by its corresponding first opening OM1. In other embodiments, an organic emission layer for emitting light of various colors such as blue, red, or white may be disposed on each first electrode E1 that is exposed by its corresponding first opening OM1.

In and around the virtual square VS, the second openings OM2 expose the second electrodes E2, and have a second polygonal shape, for example, a hexagon. The second openings OM2 are separated from each of the third openings OM3 and the first opening OM1, and the centers of the second openings OM2 coincide with the first vertex P1 and the second vertex P2 of the virtual square VS. Each of the second openings OM2 has a larger area compared to each of the first opening OM1 and the third openings OM3. The second openings OM2 in FIG. 1 have a hexagonal shape, but the present invention is not limited thereto. In other embodiments, the second openings OM2 may have various polygonal shapes such as triangles, quadrilaterals, pentagons, hexagons, heptagons, octagons, or the like.

The OLED display 1000 of FIG. 1 has a plurality of second openings OM2 that have the same hexagonal shape. The plurality of second openings OM2 are separated from each other, with each pair of diagonal second openings OM2 sharing a first opening OM1 therebetween. In the OLED display 1000 of FIG. 1, second organic emission layers OL2 for emitting blue light are disposed on the second electrodes E2 that are exposed by the second openings OM2. In other embodiments, organic emission layers for emitting light of various colors such as green, red, or white may be disposed on the second electrodes E2 that are exposed by the second openings OM2.

In and around the virtual square VS, the third openings OM3 expose the third electrodes E3, and have a third polygonal shape, for example, a quadrilateral. The third openings OM3 are separated from each of the first opening OM1 and the second openings OM2, and the centers of the third openings OM3 coincide with the third vertex P3 and the fourth vertex P4 of the virtual square VS. Each of the third openings OM3 has a larger area compared to its neighboring first opening OM1 and has a smaller area compared to each of its neighboring second openings OM2. The third openings OM3 have a quadrilateral shape (in this case, a parallelogram shape), but the present invention is not limited thereto. In other embodiments, the third openings OM3 may have various polygonal shapes such as triangles, pentagons, hexagons, heptagons, octagons, or the like.

The OLED display 1000 has a plurality of third openings OM3 that have the same quadrilateral shape. The plurality of third openings OM3 are separated from each other, with each pair of diagonal third openings OM3 sharing a first opening OM1 therebetween. In the OLED display 1000 of FIG. 1, third organic emission layers OL3 for emitting red light are disposed on the third electrodes E3 exposed by the third openings OM3. In other embodiments, organic emission layers for emitting light of various colors such as blue, green, or white may be disposed on the third electrodes E3 that are exposed by the third openings OM3.

One of the shapes, such as the first polygon, the second polygon, or the third polygon of the first opening OM1, the second opening OM2, or the third opening OM3, respectively, may have an octagonal shape. In the OLED display 1000, the plurality of first openings OM1 are sequentially arranged along virtual first lines (e.g., rows or columns), and the plurality of second openings OM2 and the plurality of third openings OM3 are respectively alternately arranged on virtual second lines (e.g., rows or columns). The virtual first lines are offset by half a pixel from the virtual second lines such that within and around each virtual square VS, the second openings OM2 of which the centers coincide with the first vertex P1 and the second vertex P2 and the third openings OM3 of which the centers coincide with the third vertex P3 and the fourth vertex P4 surround the first opening OM1 of the virtual square VS.

As described, the center of the first opening OM1 coincides with the center point of the virtual square VS, the centers of the second openings OM2 coincide with the first vertex P1 and the second vertex P2, the centers of the third openings OM3 coincide with the third vertex P3 and the fourth vertex P4, and the second openings OM2 and the third openings OM3 surround the first opening OM1 of the virtual square VS. In the OLED display 1000 of FIG. 1, the first openings OM1, the second openings OM2, and the third openings OM3 respectively have the same polygonal (octagonal, hexagonal, and quadrilateral) shapes so that, within each virtual square VS, a distance between the first opening OM1 and each of the second openings OM2, and a distance between the first opening OM1 and each of the third opening OM3 is the same first length L1, and a distance between each of the second openings OM2 and each of the third openings OM3 is the same second length L2 that is different from the first length L1. Furthermore, between neighboring virtual squares VS, a distance between respective first openings OM1 is the same third length L3 that is longer than each of the first length L1 and the second length L2.

The first organic emission layer OL1 is disposed on each of the first electrodes E1 corresponding to one of the first openings OM1. In the OLED display of FIG. 1, the first organic emission layer OL1 includes an organic material for emitting green light and thus, emits green light. In other embodiments, the first organic emission layer OL1 may include an organic material for emitting red, blue, or white light, and in this case, the first organic emission layer OL1 emits red light, blue light, or white light.

The second organic emission layer OL2 is disposed on each of the second electrodes E2 corresponding to one of the second openings OM2. In the OLED display of FIG. 1, the second organic emission layer OL2 includes an organic material for emitting blue light and thus, emits blue light. In other embodiments, the second organic emission layer OL2 may include an organic material for emitting red, green, or white light, and in this case, the second organic emission layer OL2 emits red light, green light, or white light.

The third organic emission layer OL3 is disposed on each of the third electrodes E3 corresponding to one of the third openings OM1. In the OLED display of FIG. 1, the third organic emission layer OL3 includes an organic material for emitting red light and thus, emits red light. In other embodiments, the third organic emission layer OL3 may include an organic material for emitting blue, green, or white light, and in this case, the third organic emission layer OL3 emits blue light, green light, or white light.

Thus, in the OLED display of FIG. 1, the first organic emission layer OL1, the second organic emission layer OL2, and the third organic emission layer OL3 respectively emit light of different colors (green, blue, and red, respectively). In other embodiments, the first organic emission layer OL1, the second organic emission layer OL2, and the third organic emission layer OL3 may emit light of the same color (such as white).

The first spacer SP1 is disposed between the first vertex P1 and the third vertex P3 corresponding to the first side V1 among the four sides of the virtual square VS. The first spacer SP1 is disposed as an island between the corresponding second opening OM2 and third opening OM3, and has a first center C1, which is the center of the first spacer SP1, that coincides with the first side V1. The first spacer SP1 is formed in the shape of a rectangle having long sides bisected by the first side V1 through the first center C1.

The second spacer SP2 is disposed between the third vertex P3 and the second vertex P2 corresponding to the second side V2 among the four sides of the virtual square VS. The second spacer SP2 is disposed as an island between the corresponding third opening OM3 and second opening OM2, and has a second center C2, which is the center of the second spacer SP2, that coincides with the second side V2 of the second center C2. The second spacer SP2 is formed in the shape of a rectangle having long sides bisected by the second side V2 through the second center C2.

The third spacer SP3 is disposed between the second vertex P2 and the fourth vertex P4 corresponding to the third side V3 among the four sides of the virtual square VS. The third spacer SP3 is disposed as an island between the corresponding second opening OM2 and third opening OM3, and has a third center C3, which is the center of the third spacer SP3, that coincides with the third side V3. The third spacer SP3 is formed in the shape of a rectangle having long sides bisected by the third side V3 through the third center C3.

The fourth spacer SP4 is disposed between the fourth vertex P4 and the first vertex P1 corresponding to the fourth side V4 among the four sides of the virtual square VS. The fourth spacer SP4 is disposed as an island between the corresponding third opening OM3 and second opening OM2, and has a fourth center C4, which is the center of the fourth spacer SP4, that coincides with the fourth side V4. The fourth spacer SP4 is formed in the shape of a rectangle having long sides bisected by the fourth side V4 through the fourth center C4.

As described, the first spacer SP1, the second spacer SP2, the third spacer SP3, and the fourth spacer SP4 are respectively disposed as islands corresponding to the four sides, that is, the first side V1, the second side V2, the third side V3, and the fourth side V4 of the virtual square VS, and are also formed in the shape of rectangles respectively having long sides bisected respectively by the first side V1, the second side V2, the third side V3, and the fourth side V4 through the first center C1, the second center C2, the third center C3, and the fourth center C4, so that the area ratio occupied by the first spacers SP1, the second spacers SP2, the third spacers SP3, and the fourth spacers SP4 in the entire area of the OLED display 1000 can be increased without interfering with the distances respectively set between the first openings OM1, the second openings OM2, and the third openings OM3.

The first spacer SP1, the second spacer SP2, the third spacer SP3, and the fourth spacer SP4 may be formed of the same or different material of the pixel defining layer PDL, and may include at least one of an organic material, an inorganic material, a metal, glass, or the like.

As described, within each virtual square VS, the centers C1, C2, C3, and C4 of each of the first spacer SP1, the second spacer SP2, the third spacer SP3, and the fourth spacer SP4 that neighbor the center point CP of the virtual square VS coincide with a respective one of the first side V1, the second side V2, the third side V3, and the fourth side V4 so that distances between the respective centers C1, C2, C3, and C4 of the first spacer SP1, the second spacer SP2, the third spacer SP3, and the fourth spacer SP4, and the center point CP of the virtual square VS have the same length D.

In FIG. 1, the first spacer SP1, the second spacer SP2, the third spacer SP3, and the fourth spacer SP4 have rectangular shapes, but in other embodiments, they may have other polygonal shapes such as triangles, other quadrilaterals, pentagons, hexagons, heptagons, octagons, nonagons, or the like, or closed loop shapes formed by extension of a curved line.

The common electrode CE is disposed on the first organic emission layers OL1, the second organic emission layers OL2, and the third organic emission layers OL3 throughout the entire surface of the first substrate SU1, and may be a cathode functioning as an electron injection electrode, or an anode. The common electrode CE may be formed as a light transmissive electrode or a light reflective electrode.

In FIG. 2, the common electrode CE is disposed on the first spacer SP1. In another embodiment of the present invention, the common electrode CE may be disposed between the pixel defining layer PDL and the first spacer SP1.

The second substrate SU2 is formed of an insulating substrate made of glass, quartz, ceramic, metal, plastic, or the like. In addition, when the second substrate SU2 and the first substrate SU1 are made of plastic, the OLED display may have a flexible, stretchable, or rollable characteristic.

As described above, in the OLED display 1000, within each virtual square VS, gaps of the first length L1 are formed between the first opening OM1 and each of the second openings OM2, and between the first opening OM1 and each of the third openings OM3. In addition, between neighboring virtual squares VS, gaps of the third length L3 that are longer than the first length L1 are formed between the neighboring first openings OM1 so that deposition reliability in a deposition process that uses fine metal masks that form the green organic emission layer, the blue organic emission layer, and the red organic emission layer respectively included in the first opening OM1, the second opening OM2, and the third opening OM3 can be improved. That is, deposition reliability of the OLED display 1000 can be improved.

In addition, in the OLED display 1000, within and around each virtual square VS, the second openings OM2 and the third openings OM3 are alternately arranged to surround the first opening OM1 so that an aperture ratio of each of the first opening OM1, the second openings OM2, and the third openings OM3 can be improved. Accordingly, manufacturing time and manufacturing cost of the OLED display can be reduced and quality of an image displayed by the OLED display can be improved. That is, image quality of the OLED display 1000 can be improved.

Further, in the OLED display 1000, the second openings OM2 for emitting blue light have corresponding second organic emission layers OL2 that have a shorter life span compared to those of other color pixels. Accordingly, each second opening OM2 has a larger area compared to those of the first opening OM1 and the third opening OM3 so that deterioration of the life span of the whole OLED display can be suppressed. That is, the life span of the OLED display 1000 can be improved.

As described above, in the OLED display 1000, the first opening OM1, the second opening OM2, and the third opening OM3 have polygonal shapes such as an octagon, a hexagon, a quadrilateral, or the like. Within or around each virtual square VS, the center of the first opening OM1 coincides with the center point CP of the virtual square VS, the centers of the second openings OM2 respectively coincide with the first vertex P1 and the second vertex P2, and the centers of the third openings OM3 respectively coincide with the third vertex P3 and the fourth vertex P4 to improve deposition reliability of the organic emission layer and also improve an aperture ratio of each of the first, second, and third openings OM1, OM2, and OM3 during the deposition process using the fine metal masks in consideration of a deposition process of the organic emission layer, which is another manufacturing feature of the OLED display 1000.

That is, the OLED display 1000 including the octagon-shaped first, hexagon-shaped second, and quadrilateral-shaped third openings OM1, OM2, and OM3 can be provided, and, in the OLED display 1000, deposition reliability of the organic emission layers can be improved, the life span of the organic emission layers can be improved, and the aperture ratio of each of the first openings OM1, the second openings OM2, and the third openings OM3 can be improved.

Further, in the OLED display 1000, within and around each virtual square VS, the first spacer SP1, the second spacer SP2, the third spacer SP3, and the fourth spacer SP4 are disposed as islands respectively corresponding to the first side V1, the second side V2, the third side V3, and the fourth side V4 in consideration of the shapes of the first, second, and third openings OM1, OM2, and OM3 such that the first, second, third, and fourth spacers SP1, SP2, SP3, and SP4 of which centers have the same distance D to the center point CP to which the center of the first opening OM1 coincides. Thus, the first, second, third, and fourth spacers SP1, SP2, SP3, and SP4 do not interfere with distances set between the first, second, and third openings OM1, OM2, and OM3 and also maintain a consistent ratio of the area occupied by the first, second, third, and fourth spacers SP1, SP2, SP3, and SP4 when the entire area of the OLED display 1000 is increased. Accordingly, interference of the second substrate SU2 with respect to the first organic emission layers OL1, the second organic emission layers OL2, and the third organic emission layers OL3 can be reduced or minimized, regardless of how many virtual squares VS make up the OLED display 1000.

As described, the OLED display 1000 includes the octagonal-shaped first opening OM1, the hexagonal-shaped second opening OM2, and the quadrilateral-shaped third opening OM3 in consideration of improvement of deposition reliability of the organic emission layers, improvement of life span of the organic emission layers, and improvement of the aperture ratio of each of the first, second, and third openings OM1, OM2, and OM3, and also includes the first spacer SP1, the second spacer SP2, the third spacer SP3, and the fourth spacer SP4 in consideration of the shapes of the first opening OM1, the second opening OM2, and the third opening OM3 so that the deposition reliability and life span of the organic emission layers can be improved, the aperture ratio of each of the first, second, and third openings OM1, OM2, and OM3 can be improved, and the entire mechanical reliability can be improved.

Hereinafter, an OLED display 1002 according to a second embodiment of the present invention will be described with reference to FIG. 3. For convenience of description, only features distinguished from those of the first embodiment above may be extracted and described, and portions for which the description is omitted follow the first embodiment. In addition, the same constituent elements of both embodiments will be described by using the same reference numerals as the first embodiment.

Figure 3:
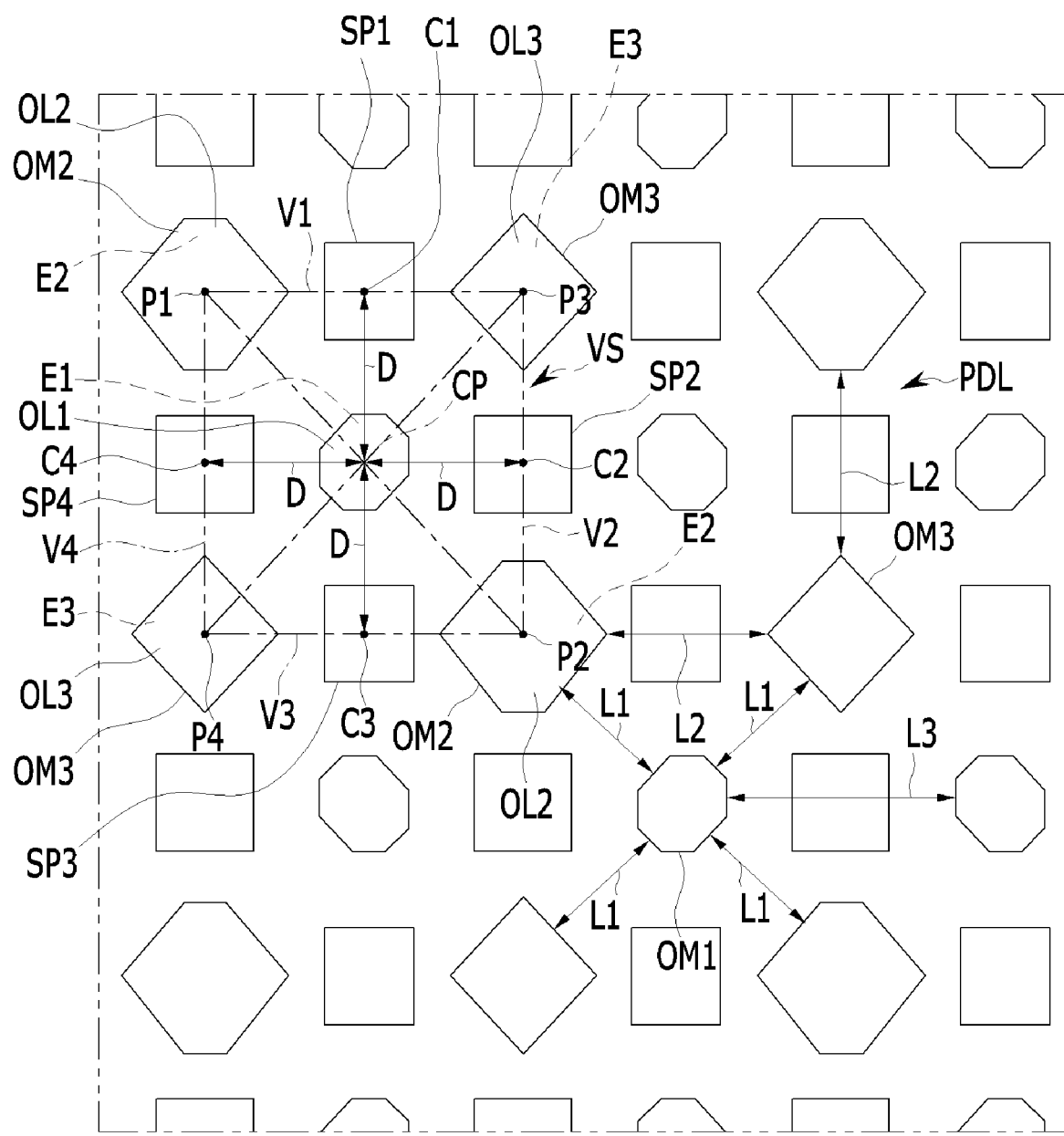
FIG. 3 partially shows a plane surface of an OLED display according to a second embodiment of the present invention.

FIG. 3 partially shows a plane surface of the OLED display 1002. As shown in FIG. 3, an OLED display 1002 includes a first spacer SP1, a second spacer SP2, a third spacer SP3, and a fourth spacer SP4, and they are respectively formed in the shape of a square.

The first spacer SP1, the second spacer SP2, the third spacer SP3, and the fourth spacer SP4 are respectively disposed as islands on a pixel defining layer PDL corresponding to four sides, namely a first side V1, a second side V2, a third side V3, and a fourth side V4, of a virtual square VS. In addition, the centers of the first to fourth spacers SP1 to SP4 respectively coincide with the first side V1, the second side V2, the third side V3, and the fourth side V4.

As described, the OLED display 1002 includes a first opening OM1, a second opening OM2, and a third opening OM3 respectively formed in the shape of an octagon, a hexagon, and a quadrilateral in consideration of improvement in deposition reliability of organic emission layers, improvement in life span of the organic emission layers, and improvement in aperture ratios of the first, second, and third openings OM1, OM2, and OM3, and also includes a first spacer SP1, a second spacer SP2, a third spacer SP3, and a fourth spacer SP4 in consideration of the shapes of the first, second, and third openings OM1, OM2, and OM3 such that the deposition reliability of the organic emission layers can be improved, the life span of the organic emission layers can be improved, and the entire mechanical reliability of the OLED display 1002 can be improved.

While the present invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims, and their equivalents.

| Description of some symbols | | |
|---|---|---|
| first electrode E1 | second electrode E2 | third electrode E3 |
| pixel defining layer PDL | spacer SP1, SP2, SP3, SP4 | |

What is claimed is:

1. An organic light emitting diode (OLED) display comprising:
    a first electrode, two second electrodes separated from the first electrode, and two third electrodes separated from the first electrode and the second electrodes, the two second electrodes being separated from each other and the two third electrodes being separated from each other;
    a pixel defining layer partially on the first electrode, the second electrodes, and the third electrodes, and having a first opening partially overlapping the first electrode, two second openings partially overlapping the two second electrodes, respectively, and two third openings partially overlapping the two third electrodes, respectively, the first opening being located around a center point of a virtual tetragon, the second openings being located at two vertices of four vertices of the virtual tetragon, and the third openings being located at two vertices of the four vertices of the virtual tetragon;
    a first organic emission layer on the first electrode and corresponding to the first opening, second organic emission layers on the second electrodes and corresponding to the second openings, and third organic emission layers on the third electrodes and corresponding to the third openings; and
    a spacer on the pixel defining layer corresponding to a portion on the first electrode and an a imaginary line extended between a center of one of the second openings and a center of one of the third openings,
    wherein the first organic emission layer emits a green color light, the second organic emission layers emit a blue color light, and the third organic emission layers emit a red color light.

2. The OLED display of claim 1,
    wherein the two second openings are located at a diagonal line of the virtual tetragon with the first opening interposed therebetween, and
    wherein the two third openings are located at a diagonal line of the virtual tetragon with the first opening interposed therebetween.

3. The OLED display of claim 2,
    wherein a plane area of each of the second openings is larger than a plane area of each of the third openings.

4. The OLED display of claim 3,
    wherein a plane area of the first opening is smaller than a plane area of each of the second openings and the third openings.

5. The OLED display of claim 2,
    wherein distances between the center of the first opening and centers of the second openings and the third openings are the same.

6. The OLED display of claim 5,
    wherein distances between adjacent ones of the second openings and the third openings are a same second length.

7. The OLED display of claim 2,
    wherein the first opening has a first polygon shape whose center coincides with the center point of the virtual tetragon,
    wherein the second openings have second polygonal shapes and the third openings have third polygonal shapes, and
    wherein the second openings and the third openings have centers coincide with the vertices of the virtual tetragon.

8. The OLED display of claim 7,
    wherein the first polygonal shape is an octagonal shape, the second polygonal shapes are a hexagon shape, and the third polygonal shapes are a quadrilateral shape.

9. The OLED display of claim 8,
    wherein a plane area of each of the second openings is larger than a plane area of each of the third openings.

10. The OLED display of claim 9,
    wherein a plane area of the first opening is smaller than a plane area of each of the second openings and the third openings.

11. The OLED display of claim 10,
    wherein distances between the center of the first opening and centers of the second openings and the third openings are the same.

12. The OLED display of claim 11,
    wherein distances between adjacent ones of the second openings and the third openings are a same second length.

13. An organic light emitting diode (OLED) display comprising:
    a first electrode, two second electrodes separated from the first electrode, and two third electrodes separated from the first electrode and the second electrodes, the two second electrodes being separated from each other and the two third electrodes being separated from each other;
    a pixel defining layer partially on the first electrode, the second electrodes, and the third electrodes, and having a first opening partially overlapping the first electrode, two second openings partially overlapping the two second electrodes, respectively, and two third openings partially overlapping the two third electrodes, respectively, the first opening being located around a center point of a virtual tetragon, the second openings being located at two vertices of four vertices of the virtual tetragon, and the third openings being located at two vertices of the four vertices of the virtual tetragon;
    a first organic emission layer on the first electrode and corresponding to the first opening, second organic emission layers on the second electrodes and corresponding to the second openings, and third organic emission layers on the third electrodes and corresponding to the third openings; and
    a spacer on the pixel defining layer corresponding to a portion on the first electrode and an a imaginary line extended between a center of one of the second openings and a center of one of the third openings, wherein the second openings and the third openings are larger than the first opening in area.

14. The OLED display of claim 13, wherein a plane area of the first opening is smaller than a plane area of each of the second openings and the third openings.

15. The OLED display of claim 14, wherein the two second openings are located at a diagonal line of the virtual tetragon with the first opening interposed therebetween, and
wherein the two third openings are located at a diagonal line of the virtual tetragon with the first opening interposed therebetween.

16. The OLED display of claim 15, wherein distances between the center of the first opening and centers of the second openings and the third openings are the same.

17. The OLED display of claim 15, wherein distances between adjacent ones of the second openings and the third openings are a same second length.

18. The OLED display of claim 15,
wherein the first opening has a first polygon shape whose center coincides with the center point of the virtual tetragon,
wherein the second openings have second polygonal shapes and the third openings have third polygonal shapes,
wherein the second openings and the third openings have centers coincide with the vertices of the virtual tetragon, and
wherein the first polygonal shape is an octagonal shape, the second polygonal shapes are a hexagon shape, and the third polygonal shapes are a quadrilateral shape.

19. The OLED display of claim 18, wherein distances between the center of the first opening and centers of the second openings and the third openings are the same.

20. The OLED display of claim 19, wherein distances between adjacent ones of the second openings and the third openings are a same second length.

* * * * *